United States Patent
Eum et al.

(10) Patent No.: US 10,541,617 B2
(45) Date of Patent: Jan. 21, 2020

(54) OVERLOAD PROTECTION FOR POWER CONVERTER

(71) Applicant: FAIRCHILD KOREA SEMICONDUCTOR, LTD., Bucheon, Gyeonggi-do (KR)

(72) Inventors: Hyun-Chul Eum, Bucheon (KR); Young-Jong Kim, Seoul (KR)

(73) Assignee: SEMICONDUCTOR COMPONENTS INDUSTRIES, LLC, Phoenix, AZ (US)

(*) Notice: Subject to any disclaimer, the term of this patent is extended or adjusted under 35 U.S.C. 154(b) by 11 days.

(21) Appl. No.: 15/604,129

(22) Filed: May 24, 2017

(65) Prior Publication Data

US 2017/0353103 A1    Dec. 7, 2017

Related U.S. Application Data

(60) Provisional application No. 62/344,780, filed on Jun. 2, 2016.

(51) Int. Cl.
*H02M 3/335*    (2006.01)
*H02M 1/08*    (2006.01)
(Continued)

(52) U.S. Cl.
CPC ......... *H02M 3/33507* (2013.01); *H02M 1/08* (2013.01); *H02M 1/32* (2013.01); *H02M 3/33515* (2013.01); *H03G 1/0088* (2013.01); *H05B 33/083* (2013.01); *H05B 33/0812* (2013.01); *H05B 33/0815* (2013.01);
(Continued)

(58) Field of Classification Search
CPC ... H02M 1/32; H02M 1/08; H02M 2001/0009
See application file for complete search history.

(56) References Cited

U.S. PATENT DOCUMENTS 5,375,029 A * 12/1994 Fukunaga .............. G05F 1/573
                                                323/285
9,614,448 B2 * 4/2017 Hayakawa ........ H02M 3/33523
(Continued)

OTHER PUBLICATIONS

Fairchild Semiconductor, "FSQ510, FSQ510H, and FSQ510M Green Mode Fairchild Power Switch (FPS™) for Valley witching Converter—Low EMI and High Efficiency," Jan. 2009.

*Primary Examiner* — Yusef A Ahmed
(74) *Attorney, Agent, or Firm* — AMPACC Law Group, PLLC (57) ABSTRACT

A method includes comparing a value of a current sense signal indicating an output signal of a power converter to a value of a threshold signal, adjusting a value of a first count signal in response to the comparison result, and determining whether or not the power converter is operating in an overload condition using the first count signal. A circuit includes an overload monitor comparing a value of a current sense signal to a value of a threshold signal, adjusting a value of a first count signal in response to the comparison result, and determining whether or not the power converter is operating in an overload condition using the first count signal. The circuit further includes an overload protection signal generator generating an overload protection signal indicating whether or not the power converter is operating in the overload condition.

18 Claims, 5 Drawing Sheets

(51) Int. Cl.
*H03G 1/00* (2006.01)
*H02M 1/32* (2007.01)
*H05B 33/08* (2006.01)
*H02M 1/00* (2006.01)

(52) U.S. Cl.
CPC ..... *H05B 33/0824* (2013.01); *H05B 33/0842* (2013.01); *H05B 33/0845* (2013.01); *H05B 33/0851* (2013.01); *H05B 33/0887* (2013.01); *H02M 2001/0009* (2013.01)

(56) References Cited

U.S. PATENT DOCUMENTS

| | | | | |
|---|---|---|---|---|
| 9,780,672 | B1* | 10/2017 | Li | H05B 33/089 |
| 9,871,453 | B2* | 1/2018 | Chen | H02H 3/027 |
| 9,979,272 | B2* | 5/2018 | Tezuka | H03K 17/687 |
| 10,243,459 | B2* | 3/2019 | Li | H02M 3/156 |
| 2002/0105767 | A1* | 8/2002 | Schuellein | H02H 7/1213 |
| | | | | 361/93.1 |
| 2003/0234642 | A1* | 12/2003 | Clegg | G01D 3/10 |
| | | | | 324/115 |
| 2006/0227476 | A1* | 10/2006 | Yang | H02M 3/33507 |
| | | | | 361/90 |
| 2007/0098059 | A1* | 5/2007 | Ives | H04B 17/102 |
| | | | | 375/224 |
| 2008/0259659 | A1* | 10/2008 | Choi | H02M 1/32 |
| | | | | 363/50 |
| 2009/0097284 | A1* | 4/2009 | Takei | H02M 1/32 |
| | | | | 363/56.1 |
| 2009/0109718 | A1* | 4/2009 | Wu | H02M 3/157 |
| | | | | 363/147 |
| 2009/0134859 | A1* | 5/2009 | Shiroyama | H02M 3/33507 |
| | | | | 323/282 |
| 2009/0153207 | A1* | 6/2009 | Kraft | H02M 1/32 |
| | | | | 327/172 |
| 2011/0182090 | A1* | 7/2011 | Huang | H02M 3/33507 |
| | | | | 363/26 |
| 2012/0147630 | A1* | 6/2012 | Cao | H02M 1/32 |
| | | | | 363/21.15 |
| 2012/0195076 | A1* | 8/2012 | Zhang | H02M 3/33523 |
| | | | | 363/21.01 |
| 2012/0274299 | A1* | 11/2012 | Chang | H02M 1/32 |
| | | | | 323/283 |
| 2013/0063112 | A1* | 3/2013 | Yang | H02M 1/32 |
| | | | | 323/282 |
| 2013/0163291 | A1* | 6/2013 | Kim | H01H 47/00 |
| | | | | 363/21.12 |
| 2013/0343096 | A1* | 12/2013 | Stuler | H02M 1/32 |
| | | | | 363/21.02 |
| 2014/0009973 | A1* | 1/2014 | Eom | H02M 3/33507 |
| | | | | 363/21.12 |
| 2014/0185340 | A1* | 7/2014 | Maruyama | H02M 1/32 |
| | | | | 363/49 |
| 2014/0247523 | A1* | 9/2014 | Kawano | H02H 9/02 |
| | | | | 361/18 |
| 2014/0313787 | A1* | 10/2014 | Chen | H02M 3/3376 |
| | | | | 363/21.01 |
| 2015/0137859 | A1* | 5/2015 | Eum | H03K 17/16 |
| | | | | 327/109 |
| 2015/0249380 | A1* | 9/2015 | Hayakawa | H02M 3/33523 |
| | | | | 363/21.16 |
| 2016/0178671 | A1* | 6/2016 | Chen | H02M 1/32 |
| | | | | 324/537 |
| 2016/0285359 | A1* | 9/2016 | Eum | H02M 1/12 |
| 2016/0315541 | A1* | 10/2016 | Chen | H02H 3/027 |
| 2017/0012542 | A1* | 1/2017 | Nishijima | H02M 3/33523 |
| 2017/0354008 | A1* | 12/2017 | Eum | H02M 1/08 |
| 2017/0366089 | A1* | 12/2017 | Matsuda | H02M 1/08 |

* cited by examiner

OVERLOAD PROTECTION FOR POWER CONVERTER

CROSS-REFERENCE TO RELATED APPLICATION

This present disclosure claims the benefit of U.S. Provisional Application No. 62/344,780 filed on Jun. 2, 2016, which is incorporated by reference herein in its entirety.

BACKGROUND

This present disclosure relates to integrated circuit devices, and more particularly to a power converter.

A power converter may convert an input voltage into an output voltage, and provide the output voltage to a load. When the output of the power converter is over loaded for an extended period, components in the power converter may be overheated and may be damaged.

Accordingly, a system for detecting a power overload and protecting the components of the power converter may be desirable.

DETAILED DESCRIPTION

Embodiments relate to power converters and detecting whether or not a power convertor is operating in an overload condition. In an embodiment, a power converter receives an input voltage and provides an output signal (e.g., an output voltage or an output current) to a load. A value of a current sense signal is compared to a value of a threshold signal, where the current sense signal indicates the output voltage of the power converter. A value of a first count signal is adjusted in response to the comparison result. A determination is made whether or not the power converter is operating in an overload condition using the first count signal.

Figure 1:
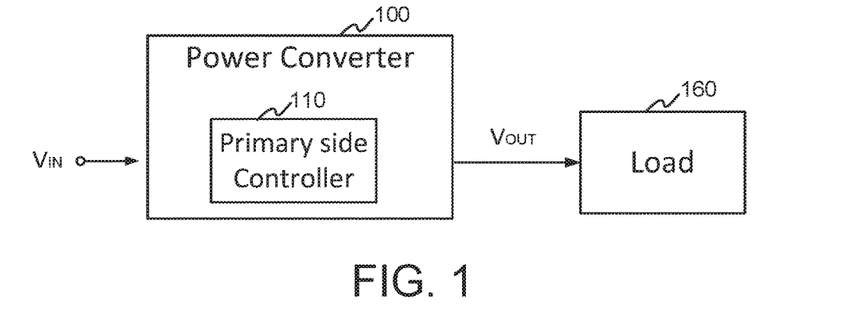
FIG. 1 illustrates a power converter according to an embodiment.

FIG. 1 illustrates a block diagram of a power converter 100 according to an embodiment. The power converter 100 in FIG. 1 receives an input voltage $V_{IN}$ and provides an output signal (e.g., an output voltage) $V_{OUT}$ to a load 160.

The power converter 100 in FIG. 1 includes a primary side controller 110. The primary side controller 110 in FIG. 1 may be integrated in a semiconductor chip, and the semiconductor chip may be packaged by itself or together with one or more other semiconductor chips.

The load 160 in FIG. 1 may include one or more integrated chips (ICs). In an embodiment, the output voltage $V_{OUT}$ is used to supply power to a Central Processing Unit (CPU), a Graphics Processing Unit (GPU), an integrated memory circuit, a battery charger, a light emitting diode (LED), or other types of electrical load.

Figure 2:
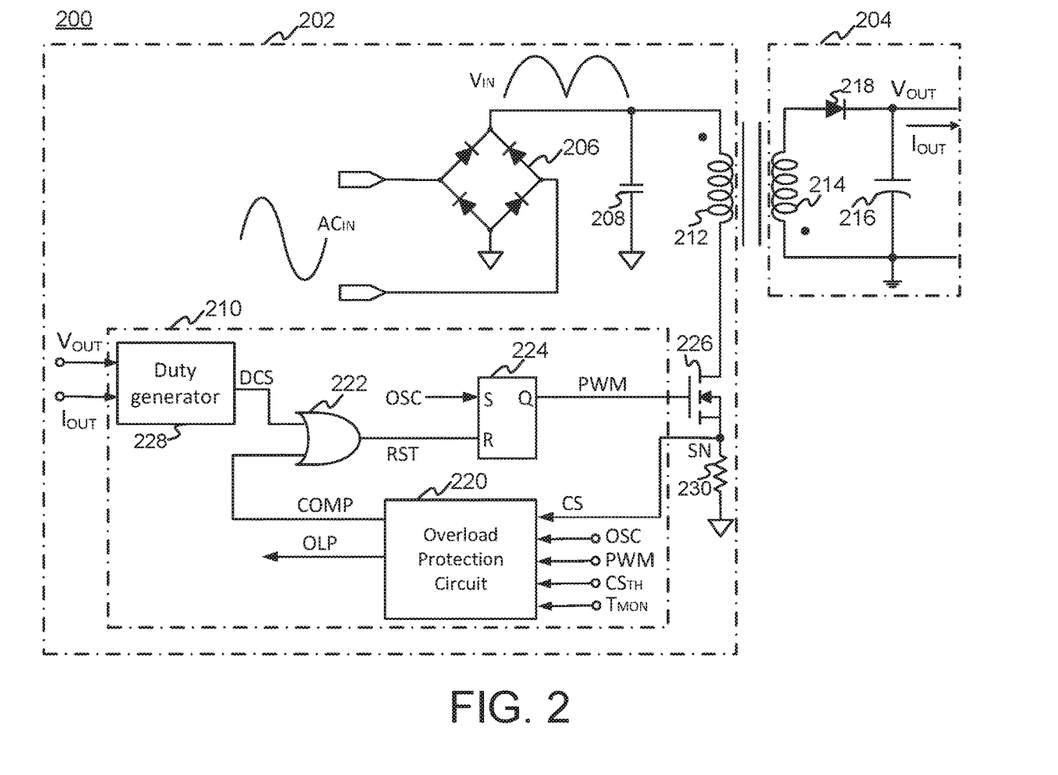
FIG. 2 illustrates a power converter suitable for use as the power converter of FIG. 1 according to an embodiment.

FIG. 2 illustrates a power converter 200 suitable for use as the power converter 100 of FIG. 1. The power converter 200 includes a primary side circuit 202 and a secondary side circuit 204.

The primary side circuit 202 in FIG. 2 includes a bridge rectifier 206, a capacitor 208, a primary winding 212, a switching device 226, a sense resistor 230, and a primary side controller 210. A power supply (not shown) provides an AC input signal $AC_{IN}$ to the bridge rectifier 206, which inverts the negative halves of the received AC signal $AC_{IN}$ to generate a rectified AC signal (or an input voltage) $V_{IN}$. The input voltage $V_{IN}$ is applied to the primary winding 212 of the power converter 200.

The primary side controller 210 in FIG. 2 includes a duty generator 228, a logic gate 222, a flip-flop 224, and an overload protection circuit 220. The primary side controller 210 in FIG. 2 receives a current sense signal CS from a sense node SN, and an output signal (or an output voltage) $V_{OUT}$ and an output current $I_{OUT}$ from the secondary side circuit 204. The primary side controller 210 in FIG. 2 generates a PWM signal (or a modulation signal) PWM to turn on or off a switching device 226. As a result, the primary side controller 210 adjusts an average magnitude of a first current flowing through the primary winding 212 in FIG. 2.

The duty generator 228 in FIG. 2 receives the output signal $V_{OUT}$ and an output current $I_{OUT}$ from the secondary side circuit 204, and generates a duty control signal DCS in response to the output signal $V_{OUT}$ and the output current $I_{OUT}$.

The logic gate 222 in FIG. 2 performs a logical operation on the duty control signal DCS and a comparison signal COMP. In an embodiment, the logic gate 222 is an OR gate and performs an OR logical operation on the duty control signal DCS and the comparison signal COMP to generate a reset signal RST.

The flip-flop 224 in FIG. 2 receives the reset signal RST and an oscillation signal OSC. In an embodiment, the flip-flop 224 is a set/reset (RS) flip-flop. In such an embodiment, the RS flip-flop 224 generates the PWM signal PWM having a logic high value when the oscillation signal OSC has a logic high value, and the PWM signal PWM having a logic low value when the reset signal RST has a logic high value.

The overload protection circuit 220 in FIG. 2 receives the current sense signal CS, the oscillation signal OSC, the PWM signal PWM, a threshold signal $CS_{TH}$, and a monitoring signal $T_{MON}$, and generates the comparison signal COMP and an overload protection signal OLP. In an embodiment, the overload protection circuit 220 may operate without using the monitoring signal $T_{MON}$ to generate the overload protection signal OLP, as will be described below with reference to FIG. 4.

When the magnitude of the first current flowing through the primary winding 212 in FIG. 2 increases, the value of the current sense signal CS also increases. When the value of the current sense signal CS exceeds a value of the threshold signal $CS_{TH}$, the overload protection circuit 220 in FIG. 2 provides the comparison signal COMP having a logic high value to the logic gate 222. The logic gate 222 in FIG. 2 provides the reset signal RST having a logic high value to the flip-flop 224, and thus the flip-flop 224 generates the PWM signal having a logic low value to turn off the switching device 226. As a result, the primary side controller 210 in FIG. 2 limits a peak value of the first current flowing through the primary winding 212 to a predetermined value.

Although the primary side controller 210 in FIG. 2 includes the logic gate 222 receiving the comparison signal COMP, embodiments of the present disclosure are not limited thereto. In an embodiment, the overload protection circuit 220 may not generate the comparison signal COMP, the logic gate 222 in FIG. 2 may be omitted, and the duty control signal DCS may be used as the reset signal RST.

The comparison signal COMP indicates whether the value of the current sense signal CS is equal to or greater than the value of the threshold signal $CS_{TH}$. In an embodiment, the comparison signal COMP having a logic high value indicates that the value of the current sense signal CS is equal to or greater than the value of the threshold signal $CS_{TH}$.

The overload protection signal OLP indicates whether the power converter 200 in FIG. 2 is operating in an overload condition. In an embodiment, the overload protection signal OLP having a logic high value indicates that the power converter 200 is operating in the overload condition.

When the overload protection circuit 220 in FIG. 2 generates the overload protection signal OLP, which indicates that the power converter 200 is operating in the overload condition, the power converter in FIG. 2 may take one or more predetermined actions. In an embodiment, the power converter 200 in FIG. 2 stops a switching operation for a predetermined time interval, and then restarts the switching operation. For example, the predetermined time interval is in a range from 1 second to 3 seconds. In another embodiment, the power converter 200 in FIG. 2 stops the switching operation until a level of the output voltage $V_{OUT}$ becomes substantially equal to 0V.

The secondary side circuit 204 in FIG. 2 includes a secondary winding 214, a diode 218, and an output capacitor 216. The diode 218 and the output capacitor 216 convert a second current flowing through a secondary winding in FIG. 2 into an output current $I_{OUT}$. When the primary side controller 210 adjusts the average magnitude of the first current flowing through the primary winding 212, a magnitude of the second current flowing through the secondary winding 214 changes, thereby regulating the output voltage $V_{OUT}$ and the output current $I_{OUT}$.

Figure 3:
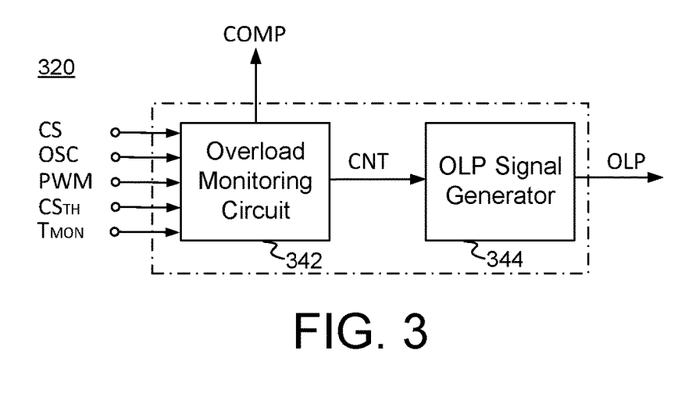
FIG. 3 illustrates an overload protection circuit suitable for use as an overload protection circuit of FIG. 2 according to an embodiment.

FIG. 3 illustrates a block diagram of an overload protection circuit 320 suitable for use as the overload protection circuit 220 of FIG. 2 according to an embodiment. The overload protection circuit 320 in FIG. 3 includes an overload monitoring circuit (or an overload monitor) 342 and an overload protection signal generator 344.

The overload monitoring circuit 342 in FIG. 3 receives a current sense signal CS, an oscillation signal OSC, a PWM signal PWM, a threshold signal $CS_{TH}$, and a monitoring signal $T_{MON}$, and generates a comparison signal COMP and a count signal CNT. For example, the overload monitoring circuit 342 compares a value of the current sense signal CS to a value of the threshold signal $CS_{TH}$ to generate the comparison signal COMP.

In an embodiment, the value of the threshold signal $CS_{TH}$ is kept substantially constant. In other embodiments, the value of the threshold signal $CS_{TH}$ is determined based on one or more of a switching frequency of the modulation signal PWM, an on-time duration of the modulation signal PWM, an instantaneous value of an input voltage (e.g., the input voltage $V_{IN}$ in FIG. 2), and a peak value of the input voltage. For example, the value of the threshold signal $CS_{TH}$ may be inversely proportional to the switching frequency of the modulation signal PWM, the value of the threshold signal $CS_{TH}$ may be proportional to the on-time duration of the modulation signal PWM, or the value of the threshold signal $CS_{TH}$ may vary with the peak value $V_{IN.PK}$ of the input voltage $V_{IN}$ as represented by the below equation.

$$CS_{TH} = A - 1/V_{IN.PK}, \text{ where } A \text{ is a constant.}$$

The overload monitoring circuit 342 in FIG. 3 adjusts a value of the count signal CNT in response to the comparison result. In an embodiment, the overload monitoring circuit 342 includes a counter circuit (e.g., a counter circuit 408 in FIG. 4), which increases the value of the count signal CNT when the value of the current sense signal CS is equal to or greater than the value of the threshold signal $CS_{TH}$. In another embodiment, the counter circuit increases the value of the count signal CNT when the value of the current sense signal CS is equal to or greater than the value of the threshold signal $CS_{TH}$ and when the monitoring signal $T_{MON}$ has a logic high value.

Figure 4:
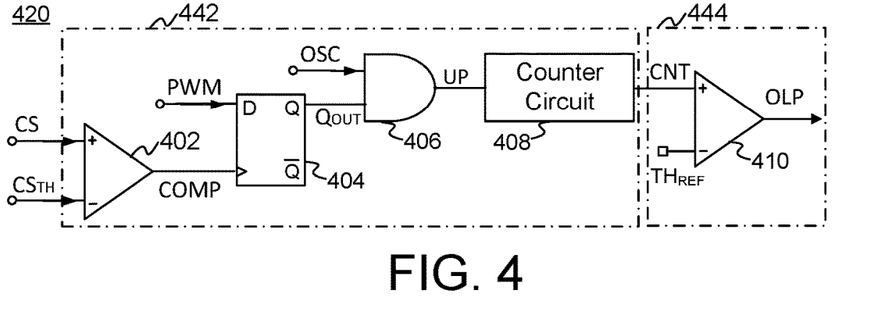
FIG. 4 illustrates an overload protection circuit suitable for use as the overload protection circuit of FIG. 2 according to an embodiment.

FIG. 4 illustrates an overload protection circuit 420 suitable for use as the overload protection circuit 220 of FIG. 2 according to an embodiment.

The overload protection circuit 420 in FIG. 4 uses a current sense signal CS and a threshold signal $CS_{TH}$ to generate an overload protection signal OLP indicating an overload condition. The overload protection circuit 420 includes a first comparator 402, a flip-flop 404, a logic gate 406, a counter circuit 408, and a second comparator 410.

The first comparator 402 in FIG. 4 compares the current sense signal CS to the threshold signal $CS_{TH}$ and generates a comparison signal COMP in response to the comparison result. In an embodiment, the comparison signal COMP has a logic high value when the current sense signal CS has a value equal to or greater than the threshold signal $CS_{TH}$.

In an embodiment, the flip-flop 404 in FIG. 4 is a D flip-flop. The D flip-flop 404 receives the comparison signal COMP and a PWM signal PWM, and generates an output signal $Q_{OUT}$ through a Q output.

The logic gate 406 in FIG. 4 receives the output signal $Q_{OUT}$ and an oscillation signal OSC, and performs a logical operation on the received signals $Q_{OUT}$ and OSC to generate a counter input signal UP. In an embodiment, the logic gate 406 in FIG. 4 is an AND gate, and performs an AND logical operation on the output signal $Q_{OUT}$ and the oscillation signal OSC.

The counter circuit 408 in FIG. 4 receives the counter input signal UP and generates a count signal CNT. In an embodiment, the counter 408 counts up from a stored value in response to an edge of the counter input signal UP and generates the count signal CNT indicating the counted up value.

The second comparator 410 in FIG. 4 compares the count signal CNT to a reference threshold voltage $TH_{REF}$ and generates the overload protection signal OLP in response to the comparison result. In an embodiment, the overload protection signal OLP has a logic high value when the count signal CNT has a voltage level equal to or greater than the reference threshold voltage $TH_{REF}$.

Figure 5:
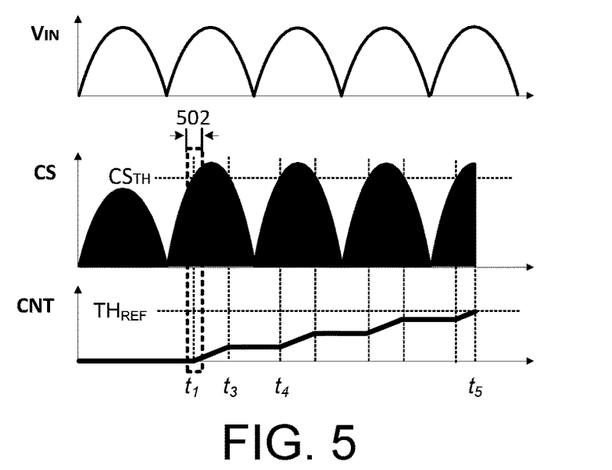
FIG. 5 illustrates example waveforms of an input voltage, a current sense signal, and a count signal according to the embodiment of the overload protection circuit in FIG. 3.
Figure 6:
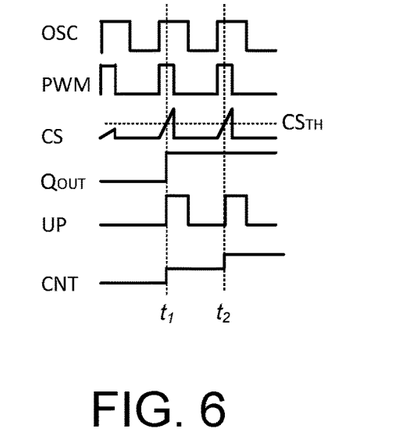
FIG. 6 illustrates example waveforms of an oscillation signal, a pulse width modulation (PWM) signal, the current sense signal, an output signal, a counter input signal, and the count signal according to the embodiment of the overload protection circuit in FIG. 3.

An operation of the overload protection circuit 420 in FIG. 4 is explained below in more detail with reference to FIGS. 5 and 6. FIG. 5 illustrates example waveforms of an input voltage $V_{IN}$, the current sense signal CS, and the count signal CNT according to an embodiment associated with FIG. 4. FIG. 6 illustrates a detailed view of a time interval 502 in FIG. 5, where FIG. 6 shows example waveforms of the oscillation signal OSC, the PWM signal PWM, the current sense signal CS, the output signal $Q_{OUT}$, the counter input signal UP, and the count signal CNT when the current sense signal CS becomes equal to or greater than the threshold signal $CS_{TH}$ at a first time $t_1$.

At the first time $t_1$ in FIGS. 5 and 6, the current sense signal CS becomes equal to or greater than the threshold signal $CS_{TH}$, and thus the first comparator 402 in FIG. 4 generates the comparison signal COMP having a logic high value. Because the PWM signal PWM in FIG. 6 has been asserted at the first time $t_1$, the Q output of the D flip-flop 404 in FIG. 4 generates the output signal $Q_{OUT}$ having a logic high value in response to a rising edge of the comparison clock signal COMP in FIG. 4. Because the oscillation signal OSC in FIG. 6 has been asserted at the first time $t_1$, the logic gate 406 in FIG. 4 generates the counter input signal UP having a logic high value. As a result, the counter circuit 408 in FIG. 4 generates the count signal CNT indicating a first value, which is increased by a predetermined magnitude in response to the counter input signal UP.

At a second time $t_2$ in FIG. 6, the current sense signal CS becomes equal to or greater than the threshold signal $CS_{TH}$ again. As a result, the counter circuit 408 in FIG. 4 generates the count signal CNT indicating a second value, which is increased from the first value by the predetermined magnitude in response to the counter input signal UP.

During a time interval between the first time $t_1$ and the second time $t_2$ in FIG. 5, the current sense signal CS remains equal to or greater than the threshold signal $CS_{TH}$. As a result, the counter circuit 408 in FIG. 4 continues to increase the count signal CNT in response to the counter input signal UP having a logic high value.

During a time interval between a third time $t_3$ and a fourth time $t_4$ in FIG. 5, the current sense signal CS becomes less than the threshold signal $CS_{TH}$. When the first comparator 402 in FIG. 4 generates the comparison signal COMP having a logic low value and does not provide a rising edge of the comparison signal COMP to the D flip-flop 404 in FIG. 4, the Q output of the D flip-flop 404 generates the output signal $Q_{OUT}$ having a logic low value. Because the logic gate 406 generates the counter input signal UP having a logic low value, the counter circuit 308 maintains the value of the counter signal CNT constant. In another embodiment, the counter circuit 308 decreases the value of the counter signal CNT in response to the counter input signal UP having a logic low value.

The overload protection circuit 420 shown in FIG. 4 repeats the operations as described above, until the value of the counter signal CNT reaches the reference threshold voltage $TH_{REF}$ at a fifth time $t_5$ in FIG. 5. At the fifth time $t_5$, the second comparator 410 in FIG. 4 generates the overload protection signal OLP having a logic high value, which indicates that a power converter (e.g., the power converter 210 in FIG. 2) is operating in an overload condition.

Figure 7:
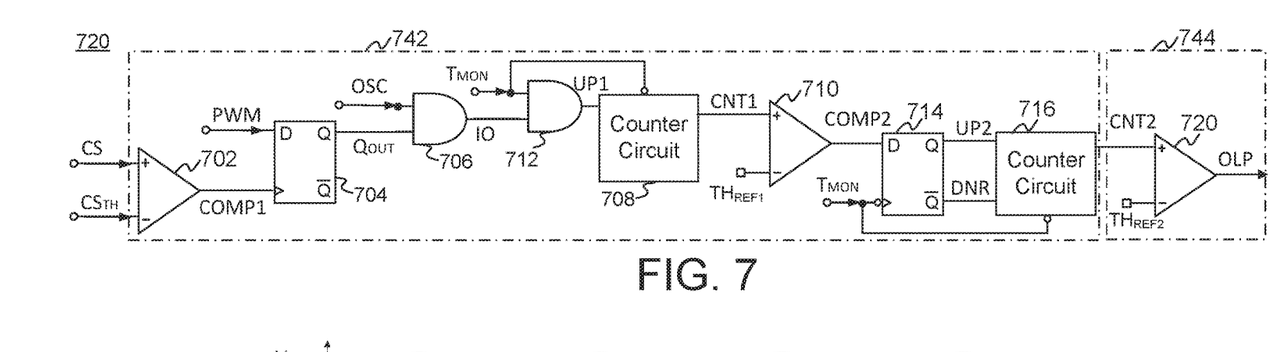
FIG. 7 illustrates an overload protection circuit suitable for use as the overload protection circuit of FIG. 2 according to an embodiment.

FIG. 7 illustrates an overload protection circuit 720 suitable for use as the overload protection circuit 220 of FIG. 2 according to an embodiment. The overload protection circuit 720 includes a first comparator 702, a first flip-flop 704, first and second logic gates 706 and 712, a first counter circuit 708, a second comparator 710, a second flip-flop 714, a second counter circuit 716, and a third comparator 720.

The first comparator 702 in FIG. 7 compares a current sense signal CS to a threshold signal $CS_{TH}$ and generates a first comparison signal COMP1 in response to the comparison result. The first flip-flop (e.g., a D flip-flop) 704 in FIG. 7 receives the first comparison signal COMP1 and a PWM signal PWM, and generates an output signal $Q_{OUT}$ through a Q output.

The first logic gate 706 in FIG. 7 receives the output signal $Q^{OUT}$ and an oscillation signal OSC, and performs a logical operation (e.g., an AND logical operation) on the received signals $Q_{OUT}$ and OSC to generate an intermediate output signal IO. The second logic gate 712 in FIG. 7 receives the intermediate output signal IO and a monitoring signal $T_{MON}$, and performs a logical operation (e.g., an AND logical operation) on the received signals IO and $T_{MON}$ to generate a first counter input signal UP1.

The first counter circuit 708 in FIG. 7 receives the first counter input signal UP1 and an inverted version of the monitoring signal $T_{MON}$, and generates a first count signal CNT1. In an embodiment, the first counter circuit 708 counts up from a stored value in response to an edge of the first counter input signal UP1, and the first counter circuit 708 is reset in response to an edge of the inverted version of the monitoring signal $T_{MON}$.

The second comparator 710 in FIG. 7 compares the first count signal CNT1 to a first reference voltage $TH_{REF1}$ and generates a second comparison signal COMP2 in response to the comparison result. The second flip flop (e.g., a D flip-flop) 714 in FIG. 7 receives the second comparison signal COMP2 and the inverted version of the monitoring signal $T_{MON}$, and generates a second counter input signal UP2 through a Q output.

The second counter circuit 716 in FIG. 7 receives the second counter input signal UP2 and generates a second count signal CNT2. In an embodiment, the second counter circuit 716 also receives a third counter input signal DNR, and the second counter circuit 716 resets the second count signal CNT2 in response to the third counter input signal DNR having a logic high value. In another embodiment, the second counter circuit 716 is an up-down counter, and the up-down counter 716 counts up in response to the second input counter signal UP2 having a logic high value and an edge (e.g., a falling edge) of the monitoring signal $T_{MON}$, and counts down in response to the third counter input signal DNR having a logic high value and the falling edge of the monitoring signal $T_{MON}$.

The third comparator 720 in FIG. 7 compares the second count signal CNT2 to a second reference voltage $TH_{REF2}$ and generates an overload protection signal OLP in response to the comparison result. In an embodiment, the overload protection signal OLP has a logic high value when the second count signal CNT2 has a voltage level equal to or greater than the second reference voltage $TH_{REF2}$.

Figure 8:
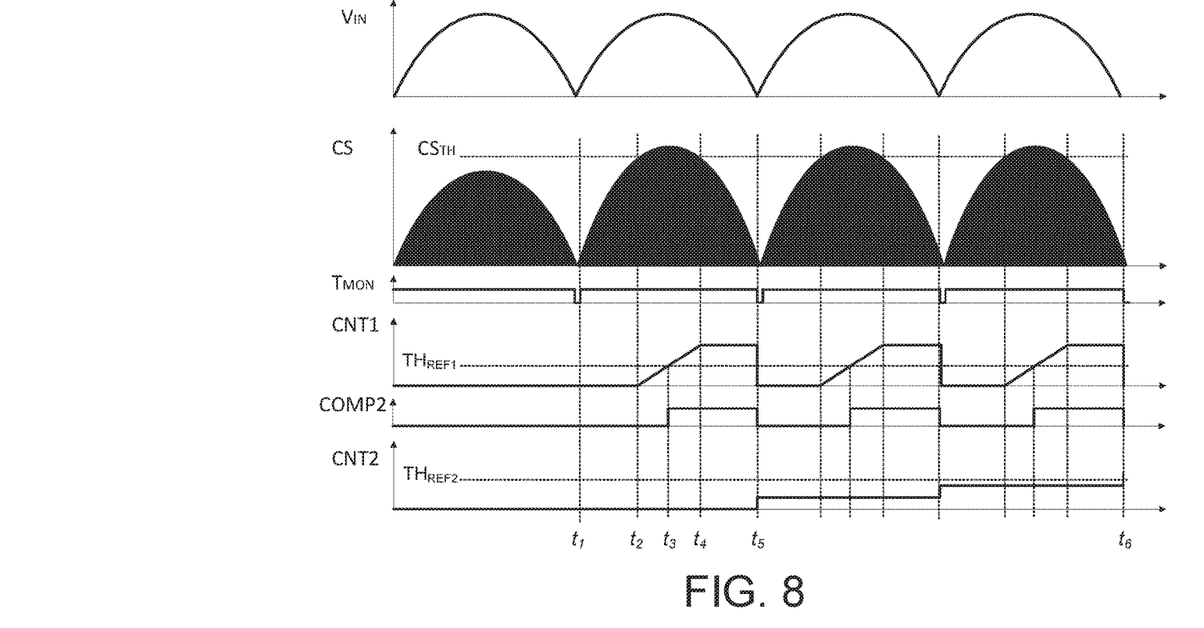
FIG. 8 illustrates example waveforms of an input voltage, a current sense signal, a monitoring signal, a first count signal, a second comparison signal, and a second count signal according to the embodiment of the overload protection circuit in FIG. 7.

An operation of the overload protection circuit 720 in FIG. 7 is explained below in more detail with reference to FIG. 8. FIG. 8 illustrates example waveforms of an input voltage $V_{IN}$, the current sense signal CS, the monitoring signal $T_{MON}$, the first count signal CNT1, the second comparison signal COMP2, and the second count signal CNT2, according to the embodiment of the overload protection circuit 720 in FIG. 7.

At a first time $t_1$, the monitoring signal $T_{MON}$ transitions from a logic low value to a logic high value.

At a second time $t_2$, the current sense signal CS becomes equal to or greater than the threshold signal $CS_1$, and thus the first comparator 702 in FIG. 7 generates the first comparison signal COMP1 having a logic high value. Operations of the first D flip-flop 704 and the first logic gate 706 in FIG. 7 are similar to those of the D flip-flop 404 and the logic gate 406 in FIG. 4, respectively, and thus detailed descriptions of the first D flip-flop 704 and the first logic gate 706 in FIG. 7 will be omitted herein for the interest of brevity.

The second logic gate 712 in FIG. 7 receives the intermediate output signal IO and the monitoring signal $T_{MON}$, and performs a logical operation (e.g., an AND logical operation) on the received signals IO and $T_{MON}$ to generate the first counter input signal UP1. As a result, the first counter circuit 708 in FIG. 7 generates the first count signal CNT1, which starts to increase by a predetermined magnitude in response to an edge (e.g., a rising edge) of the first counter input signal UP1.

At a third time $t_3$, the value of the first count signal CNT1 reaches the first reference voltage $TH_{REF1}$, and thus the second comparator 710 generates the second comparison signal COMP2 having a logic high value. In an embodiment, the first reference voltage $TH_{REF1}$ indicates a predetermined number of pulses included in the first counter input signal UP1 and the predetermined number of pulses is in a range from one to a two-digit integer.

At a fourth time $t_4$, the current sense signal CS becomes less than the threshold signal $CS_{TH}$, and thus the first comparator 702 in FIG. 7 generates the first comparison signal COMP1 having a logic low value. As a result, during a time interval from the fourth time $t_4$ and a fifth time $t_5$, the first counter input signal UP1 has a logic low value and the first counter circuit 708 in FIG. 7 maintains the value of the first count signal CNT1 constant.

At the fifth time $t_5$, the monitoring signal $T_{MON}$ transitions from a logic high value to a logic low value. The first counter circuit 708 in FIG. 7 is reset in response to an edge (e.g., a rising edge) of an inverted version of the monitoring signal $T_{MON}$. The second flip-flop (e.g., a D flip-flop) 714 generates the second counter input signal UP2 having a logic high value in response to the second comparison signal COMP2 and the rising edge of the inverted version of the monitoring signal $T_{MON}$. The second counter circuit 716 counts up from a stored value by a predetermined magnitude in response to the second input counter signal UP2 having a logic high value and the rising edge of the inverted version of the monitoring signal $T_{MON}$, and generates the second count signal CNT2.

The overload protection circuit 720 shown in FIG. 7 repeats the operation as described above, until the value of the second count signal CNT2 reaches the second reference voltage $TH_{REF2}$ at a sixth time $t_6$ in FIG. 8. In an embodiment, the second reference voltage $TH_{REF2}$ indicates a predetermined number of pulses included in the inverted version of the monitoring signal $T_{MON}$ and the predetermined number of pulses is a two-digit integer (e.g., 60). In other embodiments, the predetermined number of pulses is a one-digit integer or a three-digit integer. At the sixth time $t_6$, the third comparator 720 in FIG. 7 generates the overload protection signal OLP having a logic high value, which indicates that a power converter (e.g., the power converter 210 in FIG. 2) is operating in an overload condition.

In the embodiment shown in FIG. 8, an on-time duration of the monitoring signal $T_{MON}$ is relatively long. For example, the waveform of the monitoring signal $T_{MON}$ is substantially symmetrical with respect to a peak of the input voltage $V_{IN}$, and the on-time duration of the monitoring signal $T_{MON}$ is equal to or longer than 60%, 75%, 90%, 95%, 97%, or 99% of a cycle time of the input voltage $V_{IN}$. The cycle time of the input voltage $V_{IN}$ corresponds to a half cycle of an AC input voltage (e.g., the AC input voltage $AC_{IN}$ in FIG. 2). However, embodiments of the present disclosure are not limited thereto. In an embodiment, the on-time duration of the monitoring signal $T_{MON}$ is relatively short. For example, the waveform of the monitoring signal $T_{MON}$ is substantially symmetrical with respect to a peak of the input voltage $V_{IN}$, and the on-time duration of the monitoring signal $T_{MON}$ is equal to or less than 50%, 25%, 10%, 5%, 3%, or 1% of the cycle time of the input voltage $V_{IN}$. In another embodiment, the monitoring signal $T_{MON}$ has a logic high value during a time interval including a time at which the input voltage $V_{IN}$ becomes substantially equal to zero, and the on-time duration of the monitoring signal $T_{MON}$ is equal to or less than 25%, 10%, 5%, 3%, or 1% of the cycle time of the input voltage $V_{IN}$.

Figure 9:
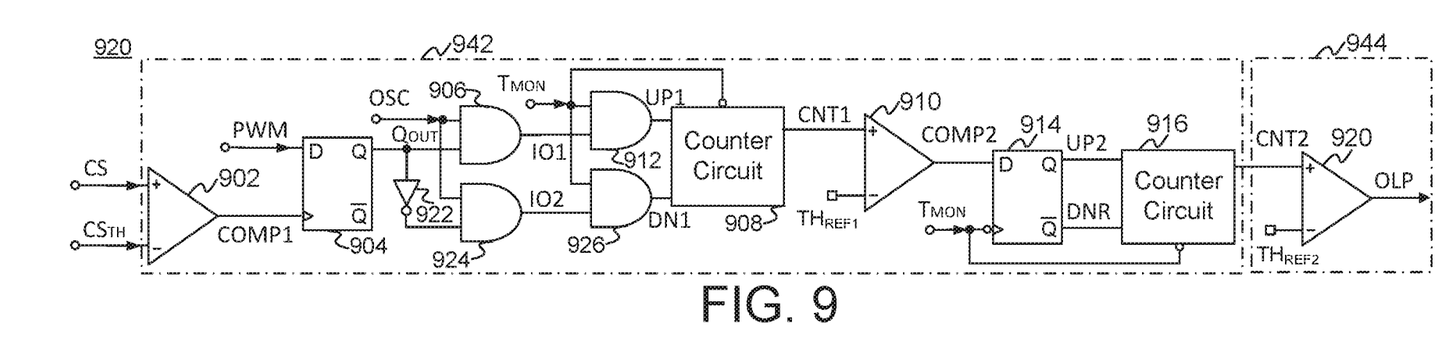
FIG. 9 illustrates an overload protection circuit suitable for use as the overload protection circuit of FIG. 2 according to an embodiment.

FIG. 9 illustrates an overload protection circuit 920 suitable for use as the overload protection circuit 220 of FIG. 2 according to an embodiment. Unlike the overload protection circuit 720 of FIG. 7, the overload protection circuit 920 in FIG. 9 includes an inverter 922 and third and fourth logic gates 924 and 926. Elements designated by references characters of the form "9xx" in FIG. 9 correspond to like-numbered elements of the form "7xx" in FIG. 7 according to an embodiment.

The inverter 922 in FIG. 9 inverts an output signal $Q_{OUT}$ and provides an inverted version of the output signal $Q_{OUT}$ to the third logic gate 924. The third logic gate 924 in FIG. 9 receives the inverted version of the output signal $Q_{OUT}$ and an oscillation signal OSC, and performs a logical operation (e.g., an AND logical operation) on the received signals $Q_{OUT}$ and OSC to generate a second intermediate output signal IO2. The fourth logic gate 926 in FIG. 9 receives the second intermediate output signal IO2 and a monitoring signal $T_{MON}$, and performs a logical operation (e.g., an AND logical operation) on the received signals IO2 and $T_{MON}$ to generate a fourth counter input signal DN1. In an embodiment, the counter circuit 908 is an up-down counter, and the fourth counter input signal DN1 causes the up-down counter 908 to count down from a stored value by a predetermined magnitude in response to an edge of the fourth counter input signal DN1. In another embodiment, the counter circuit 908 resets the first count signal CNT1 in response to the fourth counter input signal DN1.

Other operations of the overload protection circuit 920 are similar to those of the overload protection circuit 720 of FIG. 7. Therefore, detailed descriptions of these operations of the overload protection circuit 920 in FIG. 9 will be omitted herein for the interest of brevity.

Figure 10:
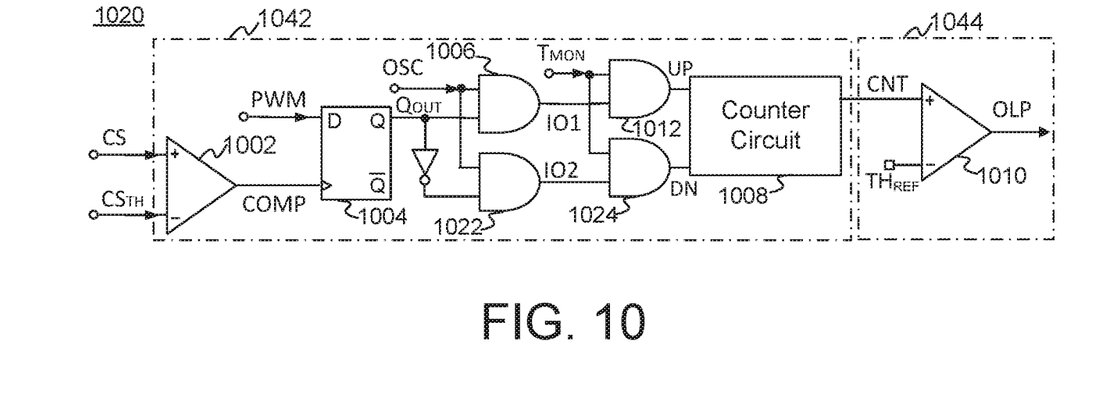
FIG. 10 illustrates an overload protection circuit suitable for use as the overload protection circuit of FIG. 2 according to an embodiment.

FIG. 10 illustrates an overload protection circuit 1020 suitable for use as the overload protection circuit 220 of FIG. 2 according to an embodiment. The overload protection circuit 1020 in FIG. 10 does not include the second comparator 910, the second flip-flop 914, and the second counter circuit 916 in FIG. 9. Elements designated by references characters of the form "10xx" in FIG. 10 correspond to like-numbered elements of the form "9xx" in FIG. 9 according to an embodiment.

A counter circuit 1008 in FIG. 10 receives a first counter input signal UP and a second counter input signal DN, and generates a count signal CNT. In an embodiment, the counter circuit 1080 is an up-down counter, and the up-down counter 1080 counts up in response to the first counter input signal UP and counts down in response to the second counter input signal DN, and generates the count signal CNT indicating the counted value.

Other operations of the remaining components of the overload protection circuit 1020 in FIG. 10 are similar to corresponding components of the overload protection circuit 920 of FIG. 9. Therefore, detailed descriptions of the operations of the overload protection circuit 1020 in FIG. 10 will be omitted herein for the interest of brevity.

A second comparator 1010 in FIG. 10 compares the count signal CNT to a reference threshold voltage $TH_{REF}$ and generates an overload protection signal OLP in response to the comparison result. In an embodiment, the overload protection signal OLP has a logic high value when the count signal CNT has a voltage level equal to or greater than the reference threshold voltage $TH_{REF}$.

Figure 11:
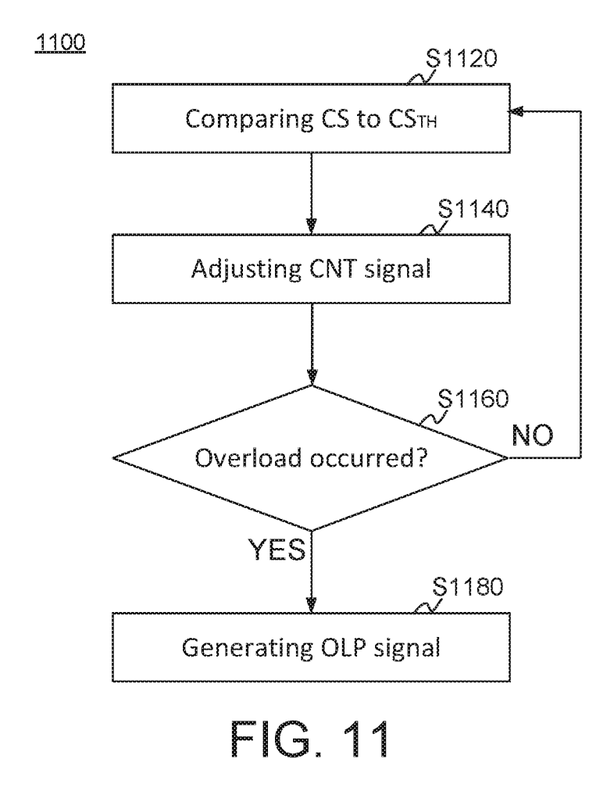
FIG. 11 illustrates a process performed by an overload protection circuit according to an embodiment.

FIG. 11 illustrates a process 1100 performed by an overload protection circuit (e.g., the overload protection circuit 220 of FIG. 2) according to an embodiment. In an embodiment, the overload protection circuit includes an overload monitoring circuit (e.g., the overload monitoring circuit 342 of FIG. 3) and an overload protection signal generator (e.g., the overload protection signal generator 344 of FIG. 3).

At S1120, the overload monitoring circuit compares a value of a current sense signal to a value of a threshold signal.

At S1140, the overload monitoring circuit adjusts a value of a count signal in response to the comparison result.

At S1160, the overload monitoring circuit determines whether or not the power converter is operating in an overload condition using the count signal. In an embodiment, the power converter is determined to be operating in an overload condition when the value of the count signal is equal to or greater than a value of a threshold signal. When the overload monitoring circuit detects the overload of the power converter, the process 1100 proceeds to S1080. Otherwise, the process 1100 returns to S1120.

At S1180, the overload protection signal generator generates an overload protection signal that has a specific logic value, causing a controller (e.g., the primary side controller 210 of FIG. 2) to take one or more predetermined actions to protect components in the power converter. The specific logic value of the overload protection signal indicating that the power converter is operating in the overload condition.

Aspects of the present disclosure have been described in conjunction with the specific embodiments thereof that are proposed as examples. Numerous alternatives, modifications, and variations to the embodiments as set forth herein may be made without departing from the scope of the claims set forth below. Accordingly, embodiments as set forth herein are intended to be illustrative and not limiting.

What is claimed is:

1. A method for controlling a power converter, the method comprising:
   comparing a value of a current sense signal to a value of a threshold signal;
   generating an output signal that has a first logic value throughout a plurality of periods of the current sense signal in response to a comparison result of the current sense signal to the threshold signal, each of the plurality of periods including a time when the value of the current sense signal is equal to or greater than the value of the threshold signal;
   adjusting a value of a first count signal in response to the output signal;
   comparing the value of the first count signal to a value of a reference signal; and
   determining whether or not the power converter is operating in an overload condition,
   wherein adjusting the value of the first count signal includes increasing the value of the first count signal when the value of the current sense signal is equal to or greater than the value of the threshold signal throughout the plurality of periods of the current sense signal.

2. The method of claim 1, further comprising:
   generating an overload protection signal that has a specific logic value when the value of the first count signal has a given value relative to that of the reference signal, the specific logic value of the overload protection signal indicating that the power converter is operating in the overload condition.

3. The method of claim 1, further comprising:
   generating a comparison signal indicative of the comparison result in response to the current sense signal and the threshold signal; and
   generating a counter input signal in response to the output signal and an oscillation signal,
   wherein the output signal is generated in response to the comparison signal and a modulation signal, and the value of the first count signal is increased in response to the counter input signal when the value of the current sense signal is equal to or greater than the value of the threshold signal, and
   wherein adjusting the value of the first count signal further includes maintaining or decreasing the value of the first count signal in response to the counter input signal when the value of the current sense signal is less than the value of the threshold signal.

4. The method of claim 1, further comprising generating an overload protection signal that has the first logic value when the value of the first count signal is equal to or greater than that of the reference signal, the first logic value of the overload protection signal indicating that the power converter is operating in the overload condition.

5. The method of claim 1, wherein the value of the threshold signal is determined based on one or more of a switching frequency of a modulation signal, an on-time duration of the modulation signal, an instantaneous value of an input voltage of the power converter, and a peak value of the input voltage.

6. The method of claim 1, wherein the plurality of periods of the current sense signal is a first plurality of periods, the method further comprising generating the output signal that has a second logic value throughout a second plurality of periods of the current sense signal when the value of the current sense signal is kept less than the value of the threshold signal.

7. A circuit for controlling a power converter comprising:
   an overload monitor configured to compare a value of a current sense signal to a value of a threshold signal, to generate an output signal that has a first logic value throughout a plurality of periods of the current sense signal in response to a comparison result of the current sense signal to the threshold signal, each of the plurality of periods including a time when the value of the current sense signal is equal to or greater than the value of the threshold signal, and to adjust a value of a first count signal in response to the output signal, the overload monitor determining whether or not the power converter is operating in an overload condition; and an overload protection signal generator configured to generate an overload protection signal indicating whether or not the power converter is operating in the overload condition, wherein the overload protection signal generator includes a first comparator comparing the value of the first count signal to a value of a reference signal.

8. The circuit of claim 7, wherein the overload monitor includes:

a counter that increases the value of the first count signal when the value of the current sense signal is equal to or greater than the value of the threshold signal.

9. The circuit of claim 8, wherein the overload monitor further comprises:

a second comparator generating a comparison signal indicative of the comparison result in response to the current sense signal and the threshold signal;

a flip-flop generating the output signal in response to the comparison signal and a modulation signal; and a logic gate generating a counter input signal in response to the output signal and an oscillation signal, and wherein the counter increases the value of the first count signal in response to the counter input signal when the value of the current sense signal is equal to or greater than the value of the threshold signal, and the counter maintains or decreases the value of the first count signal in response to the counter input signal when the value of the current sense signal is less than the value of the threshold signal.

10. The circuit of claim 7, wherein the overload monitor includes a counter that keeps increasing the value of the first count signal when the value of the current sense signal is equal to or greater than the value of the threshold signal throughout the plurality of periods of the current sense signal.

11. The circuit of claim 7, wherein the first comparator generates the overload protection signal that has the first logic value when the value of the first count signal is equal to or greater than that of the reference signal, the first logic value of the overload protection signal indicating that the power converter is operating in the overload condition.

12. The circuit of claim 7, wherein the value of the threshold signal is determined based on one or more of a switching frequency of a modulation signal, an on-time duration of the modulation signal, an instantaneous value of an input voltage of the power converter, and a peak value of the input voltage.

13. The circuit of claim 7, wherein the plurality of periods of the current sense signal is a first plurality of periods, the overload monitor is further configured to generating the output signal that has a second logic value throughout a second plurality of periods of the current sense signal when the value of the current sense signal is kept less than the value of the threshold signal.

14. The circuit of claim 7, wherein the overload monitor comprises:

a second comparator generating a comparison signal indicative of the comparison result; and a flip-flop generating the output signal in response to the comparison signal and a modulation signal.

15. A power converter comprising:

a switching device; and an overload protection circuit configured to determine an occurrence of an overload of the power converter based on a current sense signal, the current sense signal indicating a magnitude of a current that flows through the switching device, the overload protection circuit generating an overload protection signal indicating the occurrence of the overload, wherein the overload protection circuit includes:

an overload monitor configured to compare a value of the current sense signal to a value of a threshold signal, to generate an output signal that has a first logic value throughout a plurality of periods of the current sense signal in response to a comparison result of the current sense signal to the threshold signal, each of the plurality of periods including a time when the value of the current sense signal is equal to or greater than the value of the threshold signal, and to adjust a value of a count signal in response to the output signal; and an overload protection signal generator including a comparator comparing the value of the count signal to a value of a reference signal, and wherein the overload monitor includes a counter that keeps increasing the value of the count signal when the value of the current sense signal is equal to or greater than the value of the threshold signal throughout the plurality of periods of the current sense signal.

16. The power converter of claim 15, wherein the comparator generates the overload protection signal that has a specific logic value when the value of the first count signal has a given value relative to that of the reference signal, the specific logic value of the overload protection signal indicating that the power converter is operating in the overload condition.

17. The power converter of claim 15, wherein the value of the threshold signal is determined based on one or more of a switching frequency of a modulation signal, an on-time duration of the modulation signal, an instantaneous value of an input voltage of the power converter, and a peak value of the input voltage.

18. The power converter of claim 15, wherein the plurality of periods of the current sense signal is a first plurality of periods, the overload monitor is further configured to generate the output signal that has a second logic value throughout a second plurality of periods of the current sense signal when the value of the current sense signal is kept less than the value of the threshold signal.

* * * * *